(12) United States Patent
Gleixner et al.

(10) Patent No.: US 6,683,383 B2
(45) Date of Patent: Jan. 27, 2004

(54) WIREBOND STRUCTURE AND METHOD TO CONNECT TO A MICROELECTRONIC DIE

(75) Inventors: Robert J. Gleixner, San Jose, CA (US); Donald Danielson, Forest Grove, OR (US); Patrick M. Paluda, Portland, OR (US); Rajan Naik, Cambridge, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/032,623

(22) Filed: Oct. 18, 2001

(65) Prior Publication Data

US 2003/0075804 A1 Apr. 24, 2003

(51) Int. Cl.[7] .................... H01L 23/532; H01L 23/485
(52) U.S. Cl. ........................... 257/764; 257/762
(58) Field of Search ................. 257/762, 764

(56) References Cited

U.S. PATENT DOCUMENTS

| 5,172,212 | A |   | 12/1992 | Baba ........................ 257/738 |
| 6,144,100 | A |   | 11/2000 | Shen et al. ................. 257/762 |
| 6,218,732 | B1 |   | 4/2001 | Russell et al. .............. 257/748 |
| 6,329,722 | B1 | * | 12/2001 | Shih et al. .................. 257/690 |
| 6,335,104 | B1 | * | 1/2002 | Sambucetti et al. ........ 427/125 |
| 6,362,531 | B1 | * | 3/2002 | Stamper et al. ............. 257/690 |
| 6,373,137 | B1 | * | 4/2002 | McTeer ...................... 257/762 |
| 6,544,880 | B1 | * | 4/2003 | Akram ....................... 438/617 |
| 2002/0100794 | A1 |   | 8/2002 | Ho, et al. ................. 228/180.5 |

FOREIGN PATENT DOCUMENTS

| EP | 1139413 |   | 10/2001 | ......... H01L/21/60 |
| EP | 1146552 A2 | * | 10/2001 | ......... H01L/21/60 |

* cited by examiner

*Primary Examiner*—Allan R. Wilson
(74) *Attorney, Agent, or Firm*—Schwegman, Lundberg, Woessner & Kluth, P.A.

(57) ABSTRACT

A wirebond structure includes a copper pad formed on or in a surface of a microelectronic die. A conductive layer is included in contact with the copper pad and a bond wire is bonded to the conductive layer. The conductive layer is formed of a material to provide a stable contact between the bond wire and the copper pad in at least one of an oxidizing environment and an environment with temperatures up to at least about 350° C.

6 Claims, 6 Drawing Sheets

WIREBOND STRUCTURE AND METHOD TO CONNECT TO A MICROELECTRONIC DIE

FIELD OF THE INVENTION

The present invention relates generally to microelectronic dice and packaging such devices, and more particularly to a wirebond structure and method to make an electrically connection to a microelectronic die.

BACKGROUND INFORMATION

Microelectronic dice, semiconductor chips and the like are typically housed in a protective covering referred to as a package or packaging. Pins formed on the package are electrically connected by bond wires to corresponding pads formed in a substrate or inter-layer dielectric of the die or chip. The pins of the package are then used to connect the microelectronic die to a socket mounted on a circuit board, or the pins of the package may, in some designs, be directly connected to a circuit board or other substrate.

The pads formed in the inter-layer dielectric of the die are typically formed of copper and the bond wires are usually formed from aluminum or gold. Both copper and aluminum, when exposed to an oxidizing environment, such as air, will form a thin layer of oxide on the exposed surfaces. Copper is prone to continuos oxidation and aluminum is not. An oxide layer between the aluminum and copper connection will increase the electrical resistance of the conductive path formed by the copper pad and the aluminum bond wire. The strength of the electrical contact formed by connecting the aluminum bond wire directly to the copper pad can also be weak mechanically and deteriorate over time.

Additionally, aluminum and copper can react with one another when exposed to high temperatures such as those used in testing microelectronic dice, circuit boards and the like or in specialized applications where high temperatures and oxidizing environments may be encountered. Exposure to high temperatures, such as up to about 200° Celsius or higher, can cause the connection formed between the aluminum bond wire and the copper pad to be unstable resulting in breakage and a disconnection of the bond or resulting in bonds that will be more susceptible to deterioration over time. High temperatures can also cause increased oxidation of the metals and an increase in the electrical resistance between the copper and aluminum bond or connection. While such high temperatures are not expected to be encountered in most applications, microelectronic dice and circuits are tested at such temperatures to insure the reliability and stability of these devices and their connections over time and under all normal environmental conditions.

One known wirebond structure 100 is shown in FIG. 1. A copper bond pad 102 is formed in an inter-layer dielectric 104 of a package 105. A silicon nitride passivation layer 106 may be formed on a surface 108 of the inter-layer dielectric 104 and over a top surface 110 of the copper bond pad 102. A polyimide passivation layer 112 may be formed over the silicon nitride layer 106. An opening 114 is formed in the polyimide layer 112 and the silicon nitride layer 106 to expose at least a portion of the top surface 110 of the copper bond pad 102. A first thin barrier layer 116 of tantalum is formed on the top surface 110 of the copper pad 102 and a second thicker layer 118 of aluminum is formed on the tantalum barrier layer 116. The tantalum barrier layer 116 and the second layer 118 of aluminum must be etched to form the wirebond structure 100. The aluminum bond wire 120 is then attached to the second layer 118. Accordingly, the wirebond structure 100 requires a multiple layer interface including the first barrier layer 116 to contact the copper pad 102 and the second layer 118 of aluminum to make contact with the aluminum bond wire 120. Forming and etching each of these layers 116 and 118 requires additional process steps and materials that increase the cost and time of production.

Accordingly, for the reasons stated above and for other reasons that will become apparent upon reading and understanding the present specification, there is a need for a wirebond structure that includes only a single layer of conductive material between the aluminum bond wire and the copper pad. Additionally, there is a need for a wirebond structure that forms a stable, robust bond or connection between the aluminum bond wire and the copper pad and that can withstand oxidizing environments and high temperatures and that maintains its integrity over time and under most operating conditions.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1:
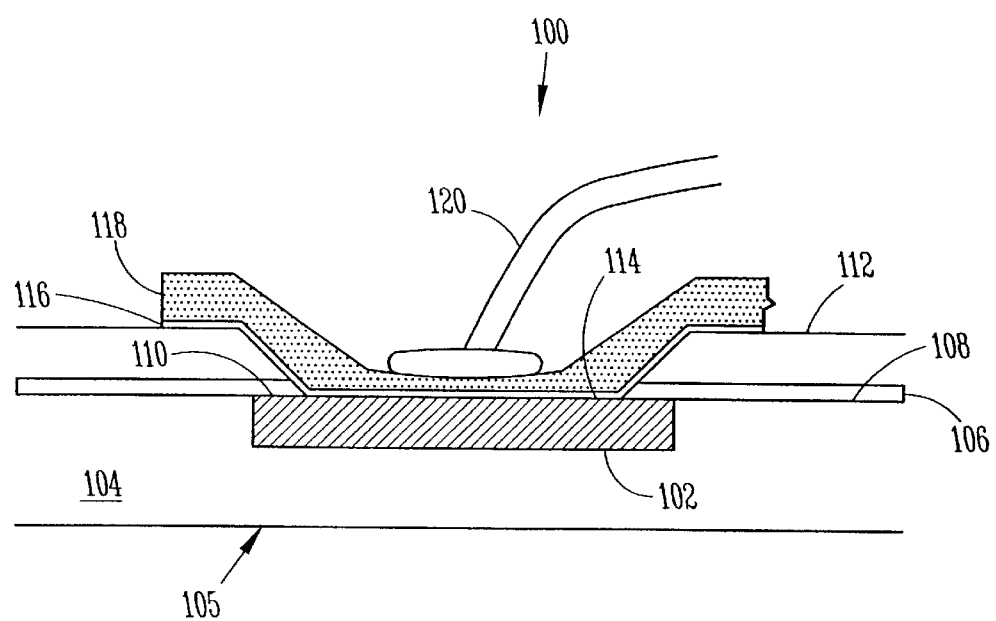
FIG. 1 is a prior art wirebond structure including a multiple layer interface between an aluminum bond wire and a copper bond pad.
Figure 2:
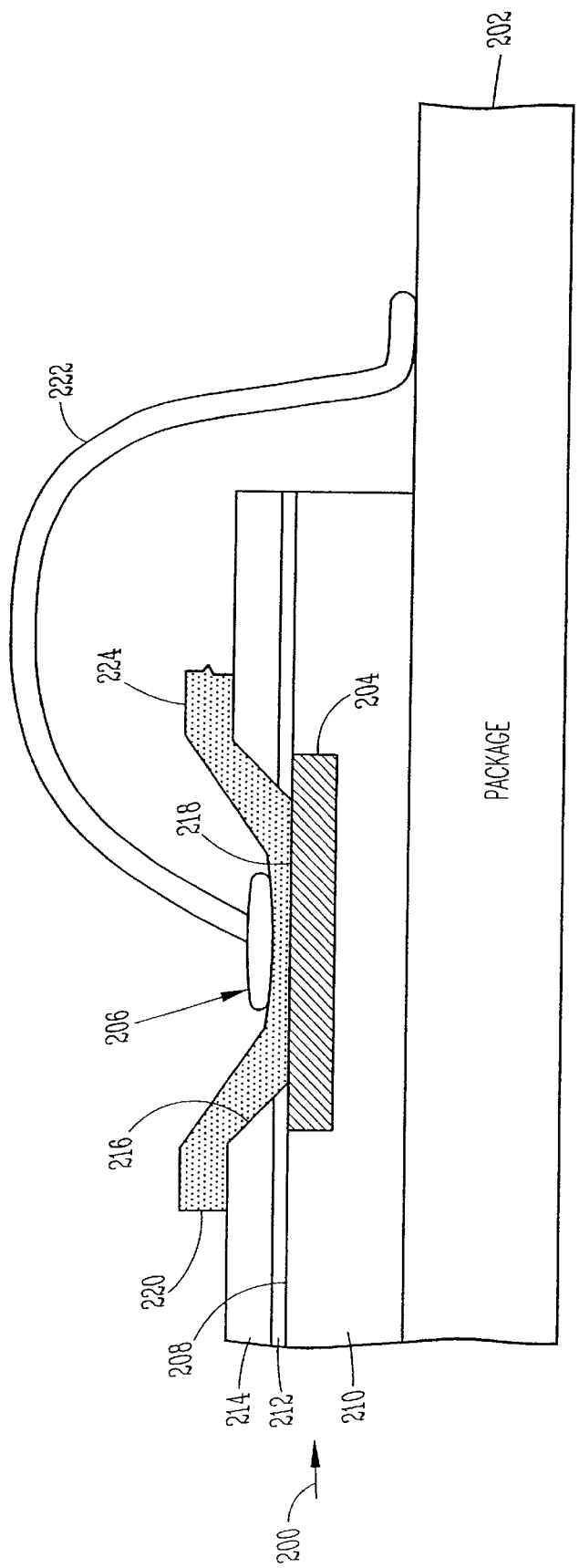
FIG. 2 is a cross-section of a wirebond structure to connect to a microelectronic die in accordance with the present invention.

FIG. 2 is a cross-section of a wirebond structure 206 to connect to a microelectronic die 200 in accordance with the present invention. FIG. 2 shows a partial view of a microelectronic die package 202 connected to the microelectronic die 200 or integrated circuit by the wirebond structure or assembly 206 in accordance with the present invention. The wirebond structure 206 of the microelectronic die 200 includes a copper bond pad 204 that is formed in a surface 208 of an inter-layer dielectric 210 or substrate of the microelectronic die 200. A first passivation layer 212 may be formed on the surface 208 of the inter-layer dielectric 210 and over the copper bond pad 204. Layer 212 may be silicon nitride or the like. A second passivation layer 214 may be formed on the first layer 212. The second passivation layer 214 may be a polyimide or the like. An opening 216 is formed in the first and second passivation layers 214 and 216 to expose at least a portion of a top surface 218 of the copper bond pad 204. A layer 220 of conductive material is formed on the top surface 218 of the copper bond pad 204 and the second passivation layer 214. A bond wire 222 is attached to the microelectronic die 200 by bonding to the conductive layer 220. The bond wire 222 may be bonded to the conductive layer 220 by a standard aluminum bonding process, such as ultrasonic wedge bonding or the like.

Different materials may be used to form the conductive layer 220 including palladium, platinum and gold which can be formed by electroless plating; however, under high temperature conditions and in oxidizing environments a passivation layer of titanium for the conductive layer 220 provides superior performance and stability in combination with a copper bond pad 204 and an aluminum bond wire 222. Titanium is compatible with both copper and aluminum in forming strong, robust electrical connections with minimal in-line resistance. Additionally, annealing the microelectronic die package 200 at a selected temperature for a predetermined period of time causes the conductive layer 220 or passivation layer of titanium to react with the aluminum bond wire 222 to form a more stable electrical connection that will not break, disconnect or corrode in an oxidizing environment or in an environment with high temperatures of up to about 350° C. or more. A selected annealing temperature of about 400° C. and a predetermined time period of at least about 10 seconds was found to cause the titanium layer 220 to react with the aluminum bond wire 222 to form a stable connection under testing conditions.

A plurality of bond wires 222 are typically connected to a microelectronic die 200. Each bond wire is coupled to a corresponding one of a plurality of bond pads 204 formed in the inter-layer dielectric 210 of the die 200. Accordingly, portions of the conductive layer 220 may be selectively removed according to a predetermined pattern to form a plurality of individual electrical contacts 224 each overlying and connected to an associated one of the plurality of copper bond pads 204. Each electrical contact 224 bonds the associated copper bond pad 204 to the corresponding bond wire 222 after the bond wire 222 is attached or bonded to the electrical contact 224 by a wedge bond process or the like.

Figure 3A:
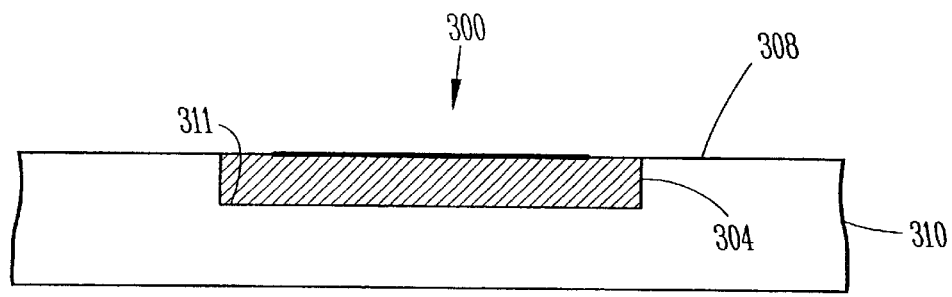
FIGS. 3A–3I illustrate the operations in forming the wirebond structure to connect to a microelectronic die in accordance with the present invention.

FIGS. 3A–3I illustrate operations in forming the wirebond structure or assembly 206 of FIG. 2 to connect a bond pad 204 of an integrated circuit or microelectronic die 200 to a microelectronic die package 202 in accordance with the present invention. In FIG. 3A, a copper bond pad 304 which is the same as the copper bond pad 204 in FIG. 2 is formed in an inter-layer dielectric 310 or substrate of the microelectronic die 300. The copper bond pad 304 may be formed by any known method, such as forming a hole 311 in a top surface 308 of the inter-layer dielectric 310 by photolithographic techniques and etching or the like and then depositing the copper by electroplating or similar techniques.

Figure 3B:
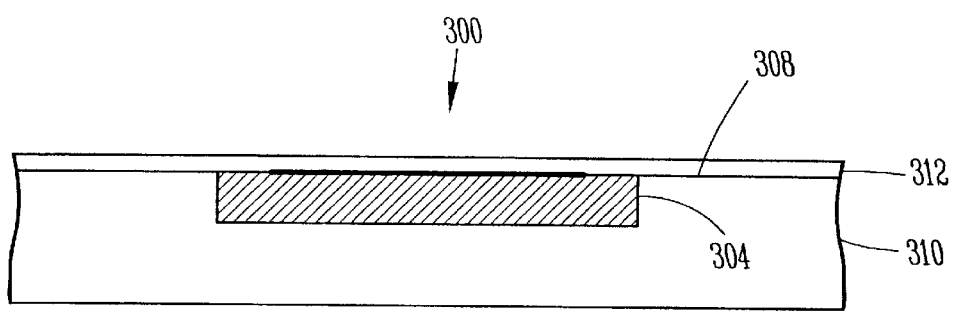
Figure 3C:
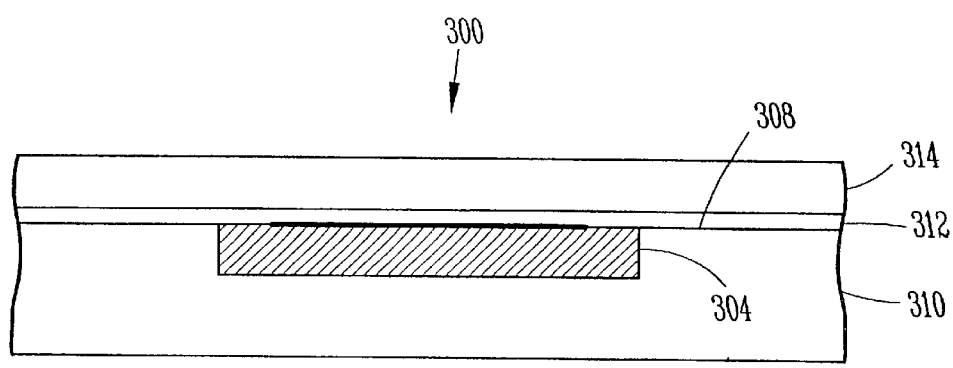
Figure 3D:
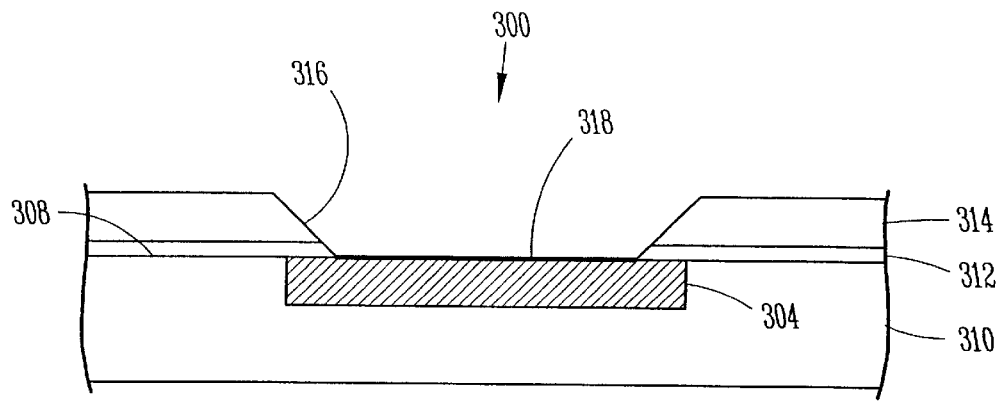

In FIG. 3B, a first passivation layer 312 may be formed on the surface 308 of the inter-layer dielectric 310 and over the copper bond pad 304. The first passivation layer 312 may be silicon nitride or a similar passivation material. In FIG. 3C, a second passivation layer 314 may be formed on the first passivation layer 312. The second passivation layer 314 may be a polyimide or a similar passivation material. In FIG. 3D, an opening 316 is formed through the first and second passivation layers 312 and 314 to expose at least a portion of a top surface 318 of the copper bond pad 304. The opening 316 may be formed using photolithographic techniques and mechanical or chemical removal processes or etching to remove the portions of the first and second passivation layers 312 and 314.

Figure 3E:
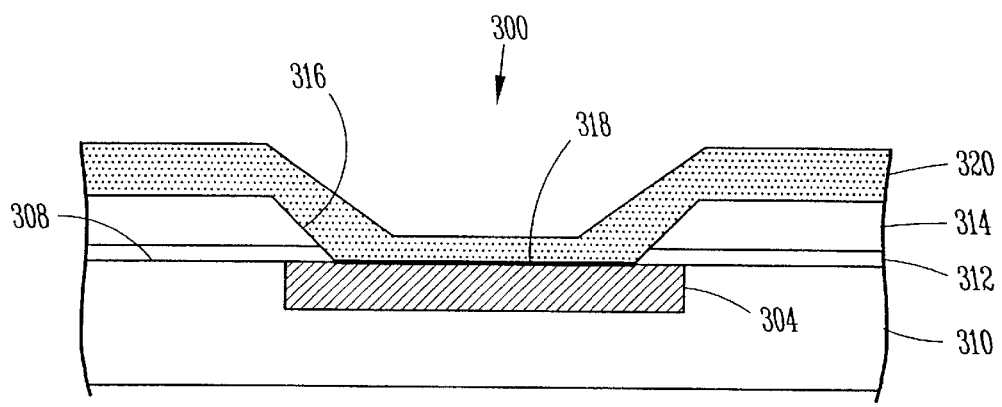
Figure 3F:
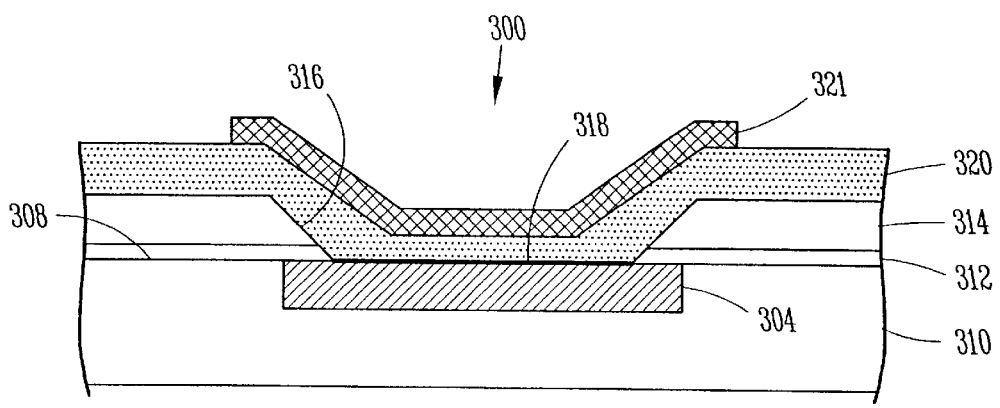
Figure 3G:
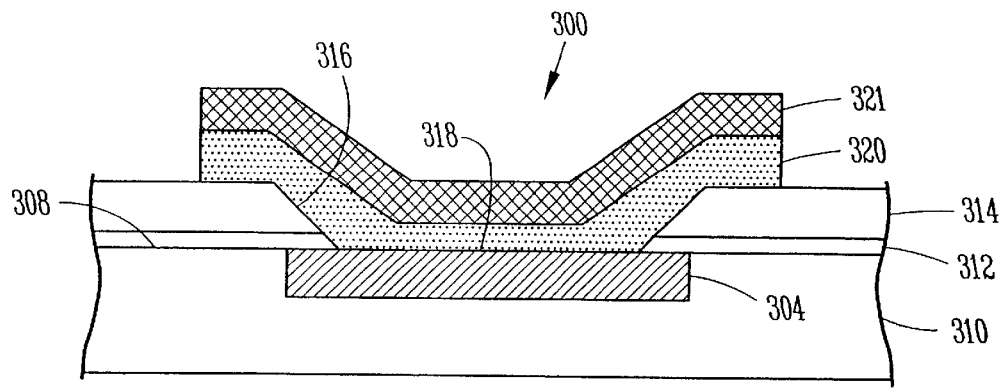
Figure 3H:
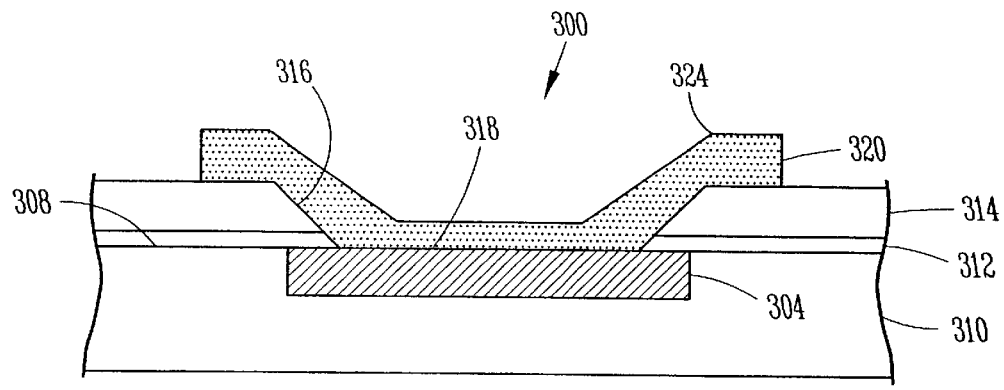
Figure 3I:
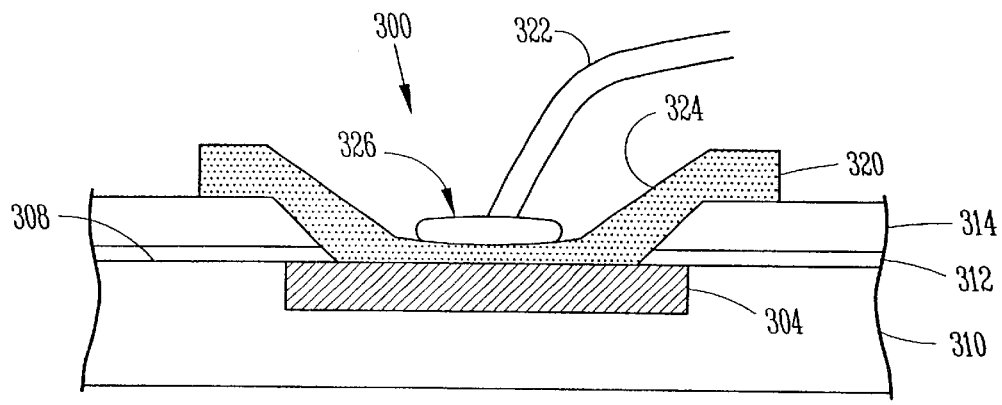

In FIG. 3E, a blanket layer 320 of conductive material is formed in contact with the top surface 318 of the copper bond pad 304 and over the second passivation layer 314. The top surface 318 of the copper bond pad 304 should preferably be free of any oxidation before deposition of the blanket layer 320 of conductive material. A dilute acetic acid dip may be used to clear the top surface 318 of the copper bond pad 304 of any oxidation. In accordance with the present invention, the blanket layer 320 of conductive material is preferably a passivation layer of titanium to form a stable bond or contact between the copper bond pad 304 and the aluminum bond wire 222 (FIG. 2). The titanium blanket layer 320 may be formed by sputter deposition. The thickness of the titanium layer may range from hundreds of nanometers to several microns. In FIG. 3F, a layer 321 of photoresist material is formed on the blanket layer 320 of conductive material. The photoresist layer 321 may be exposed and developed using standard photoresist processes to form a predetermined pattern covering the underlying conductive blanket layer 320. The patterned photoresist layer 321 covers and protects those portions of the underlying conductive blanket layer 320 that cover and are in contact with the bond pad or pads 304. In FIG. 3G, the portions of the conductive blanket layer 320 not covered and protected by the photoresist layer 321 are selectively removed by mechanical etching, chemical etching or other means to form the conductive layer 320 according to the predetermined pattern. A wet chemical etch including hydrogen peroxide, ammonium hydroxide and water may be used to remove unprotected portions of a titanium conductive or passivation layer 320. In FIG. 3H, the remaining photoresist layer 321 is removed or stripped away to form an electrical contact 324 from the layer 320 of conductive material. In FIG. 3I, an aluminum bond wire 322 is attached or bonded to the electrical contact 324 by ultrasonic wedge bonding or the like. A gold ball bond technology was tried but did not provide adequate adhesion to the titanium conductive layer 320.

The wirebond structure 326 shown in FIG. 3I may be annealed at a selected temperature for a predetermined period of time to form a robust, stable bond between the aluminum bond wire 322, the electrical contact 324 and the copper bond pad 304. For a titanium electrical contact 324, the selected temperature may be about 400° C. and the predetermined time period may be at least about 10 seconds to drive a reaction between the aluminum bond wire 322 and the titanium contact 324.

While the present invention in FIGS. 3A–3I was described for a single bond wire 322 being coupled to a single bond pad 304, it should be noted that a typical die 200 (FIG. 2) will have a plurality of bond wires 222 or 322 in FIGS. 3A–3I to be coupled to a plurality of bond pads 204 or 304 in FIGS. 3A–3I. The operations described with reference to FIGS. 3A–3I are, therefore, equally applicable to multiple bond wires 322 and bond pads 304.

Figure 4:
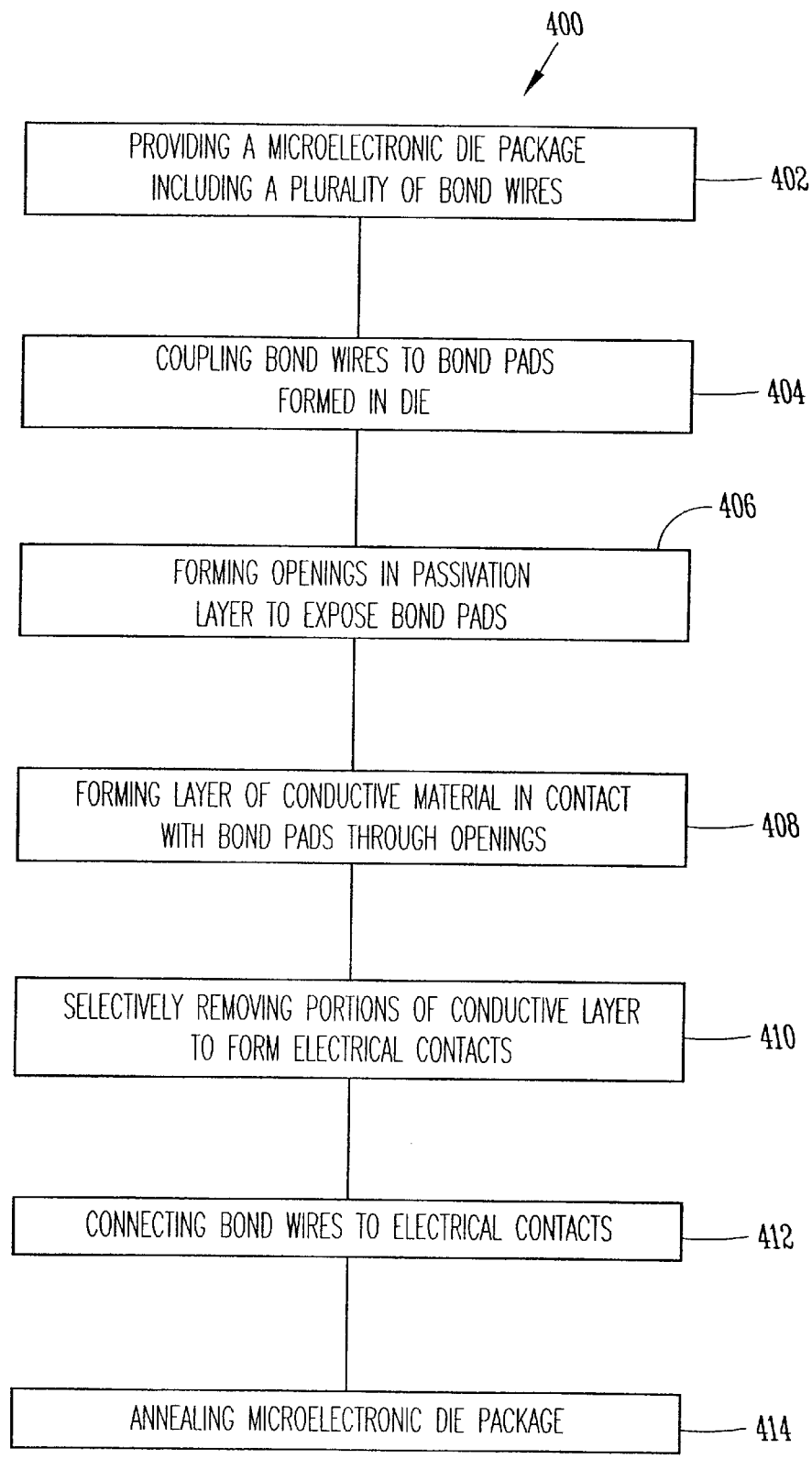
FIG. 4 is a flow chart of a method of making a microelectronic die package including connecting the package to a microelectronic die by a wirebond structure in accordance with the present invention.

FIG. 4 is a flow chart of a method 400 of making a microelectronic die package 202 including connecting the package 202 to a microelectronic die 200 or 300 by wirebond structures 206 or 326 similar to that shown in FIGS. 2 and 3. Block 402 provides or forms a microelectronic die package 202 that includes a plurality of bond wires 222. Block 404 couples or bonds each of the plurality of bond wires 222 to a corresponding one of a plurality of bond pads 204 formed in a surface 208 of a substrate or inter-layer dielectric 210 of the die 200. To couple or bond each of the plurality of bond wires 222 to the corresponding one of the plurality of bond pads 204, a plurality of openings 216 are formed in at least one layer 212 and 214 of passivation material to expose at least a portion of a top surface 218 of each of the plurality of bond pads 204 in block 406. In block 408, a layer 224 of conductive material, preferably titanium, is formed in contact with the top surface 218 of each of the plurality of bond pads 204 through the openings 216. In block 410, portions of the layer 224 of conductive material are selectively removed according to a predetermined pattern to form a plurality of separate electrical contacts 224. Each electrical contact 224 is electrically connected to a corresponding one of the plurality of bond pads 204. In block 412, each of the plurality of bond wires 222 of the microelectronic die 202 is electrically connected to a corresponding one of the plurality of separate electrical contacts 224 and in block 414 the completed microelectronic die package 200 may be annealed at a selected temperature for a predetermined period of time. For an aluminum bond wire 222 and a titanium contact 224, the selected temperature is about 400° C. for about 10 seconds.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A wirebond structure, comprising:

a substrate;

a copper pad formed on a surface of the substrate;

at least one layer of passivation material formed on the substrate and covering the copper pad;

a single layer of conductive material formed on the at least one layer of passivation material and in contact with the copper pad through an opening formed in the at least one layer of passivation material; and a bond wire bonded to the single conductive layer, wherein the bond wire is a different material than the copper pad and the single layer of conductive material provides adhesion between the bond wire and the copper pad, wherein the single layer of conductive material comprises titanium.

2. A wirebond structure, comprising:

a substrate;

a copper pad formed on a surface of the substrate;

at least one layer of passivation material formed on the substrate and covering the copper pad;

a single layer of conductive material formed on the at least one layer of passivation material and in contact with the copper pad through an opening formed in the at least one layer of passivation material; and a bond wire bonded to the single conductive layer, wherein the bond wire is a different material than the copper pad and the single layer of conductive material provides adhesion between the bond wire and the copper pad, wherein the single layer of conductive material comprises titanium and the bond wire comprises aluminum and wherein the single layer of conductive material and the bond wire are annealed at a selected temperature for a predetermined period of time.

3. A microelectronic die, comprising:

a substrate;

a plurality of copper bond pads formed on the substrate;

at least one layer of passivation material formed on the substrate and covering the plurality of copper bond pads;

a plurality of electrical contacts each formed from a single conductive layer of titanium, each of the plurality of electrical contacts being connected to a corresponding one of the plurality of copper bond pads through openings formed in the at least one layer of passivation material; and a plurality of bond wires each bonded to a corresponding one of the plurality of electrical contacts.

4. The microelectronic die of claim 3, wherein each of the plurality of bond wires comprises aluminum.

5. The microelectronic die of claim 3, wherein each of the plurality of the bond wires comprises aluminum and wherein the microelectronic die is annealed at a selected temperature for a predetermined period of time.

6. The microelectronic die of claim 3, wherein the substrate is an inter-layer dielectric of the microelectronic die.

* * * * *